United States Patent
Hsieh et al.

(10) Patent No.: US 9,728,407 B2
(45) Date of Patent: Aug. 8, 2017

(54) METHOD OF FORMING FEATURES WITH VARIOUS DIMENSIONS

(71) Applicant: Taiwan Semiconductor Manufacturing Company, Ltd., Hsin-Chu (TW)

(72) Inventors: Ken-Hsien Hsieh, Taipei (TW); Chi-Cheng Hung, Miaoli County (TW); Chih-Ming Lai, Hsinchu (TW); Wei-Liang Lin, Hsin-Chu (TW); Chun-Kuang Chen, Hsinchu County (TW); Ru-Gun Liu, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/983,743

(22) Filed: Dec. 30, 2015

(65) Prior Publication Data

US 2017/0194146 A1    Jul. 6, 2017

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2006/0091468 A1 | 5/2006 | Liaw | |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0220493 A1* | 8/2014 | Shieh | G03F 7/20 430/319 |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |

(Continued)

*Primary Examiner* — Allan Olsen
(74) *Attorney, Agent, or Firm* — Haynes and Boone, LLP

(57) ABSTRACT

A method of fabricating a semiconductor device is disclosed. The method includes forming mandrels over a material layer and forming spacers along sidewalls of mandrels, forming a patterned hard mask to cover a first region, depositing a filling layer in a second region while the patterned hard mask covers the first region. A space between two adjacent spacers in the second region is filled in by the filling layer. The method also includes recessing the filling layer to form a filling block in the space between two adjacent spacers in the second region, removing the patterned hard mask, removing mandrels and etching the material layer by using spacers and the filling block as an etch mask to form material features in the first region and the second region, respectively.

20 Claims, 11 Drawing Sheets

(56) References Cited

U.S. PATENT DOCUMENTS

2015/0155171 A1* 6/2015 Chang ................ H01L 21/0338
 438/703
2015/0311063 A1* 10/2015 Ou ...................... H01L 21/0274
 257/622

* cited by examiner

METHOD OF FORMING FEATURES WITH VARIOUS DIMENSIONS

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in forming smaller critical dimension features with various dimensions are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
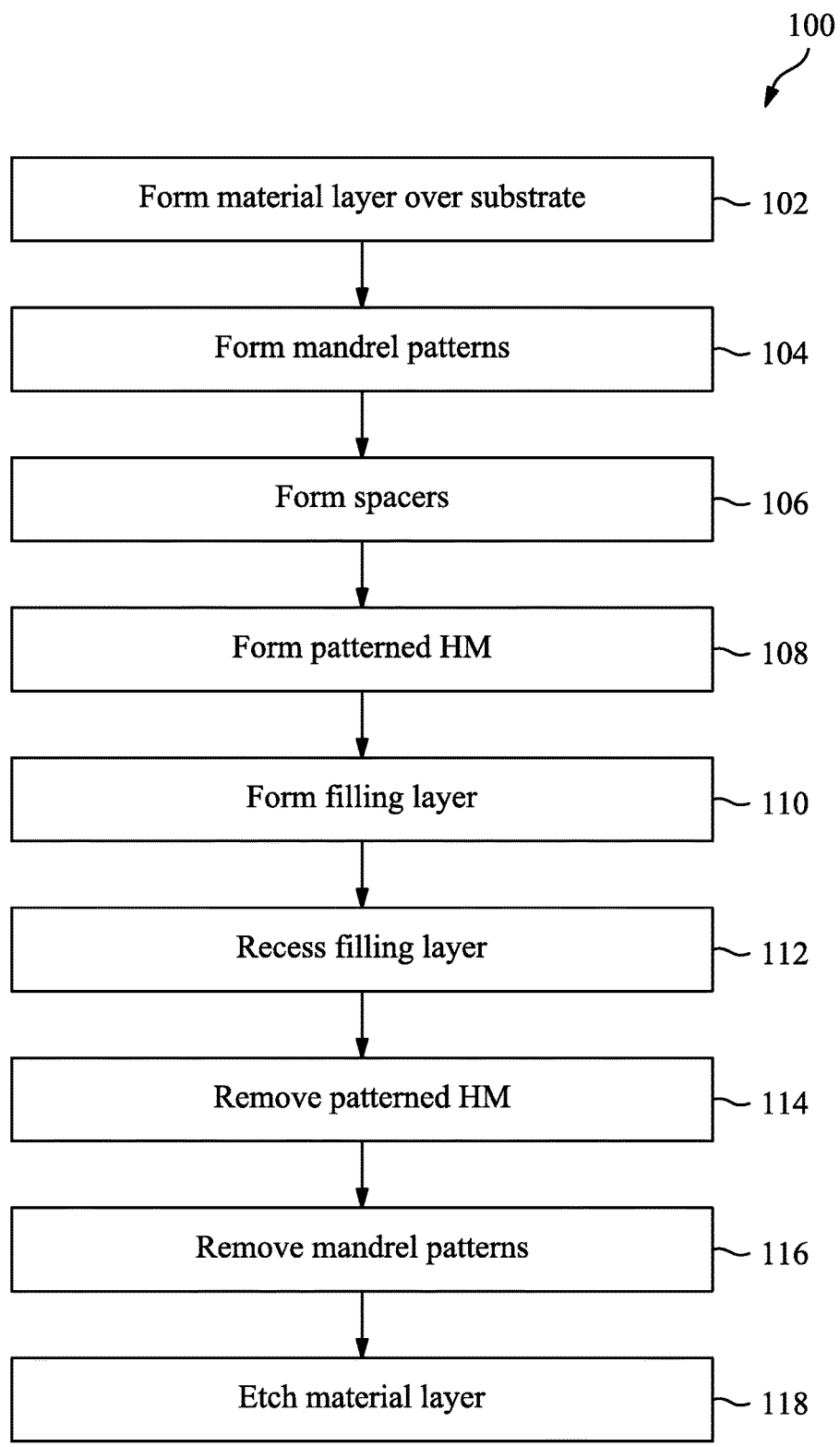
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3, 4, 5, 6A, 6B, 7, 8, 9 and 10.

Figure 2:
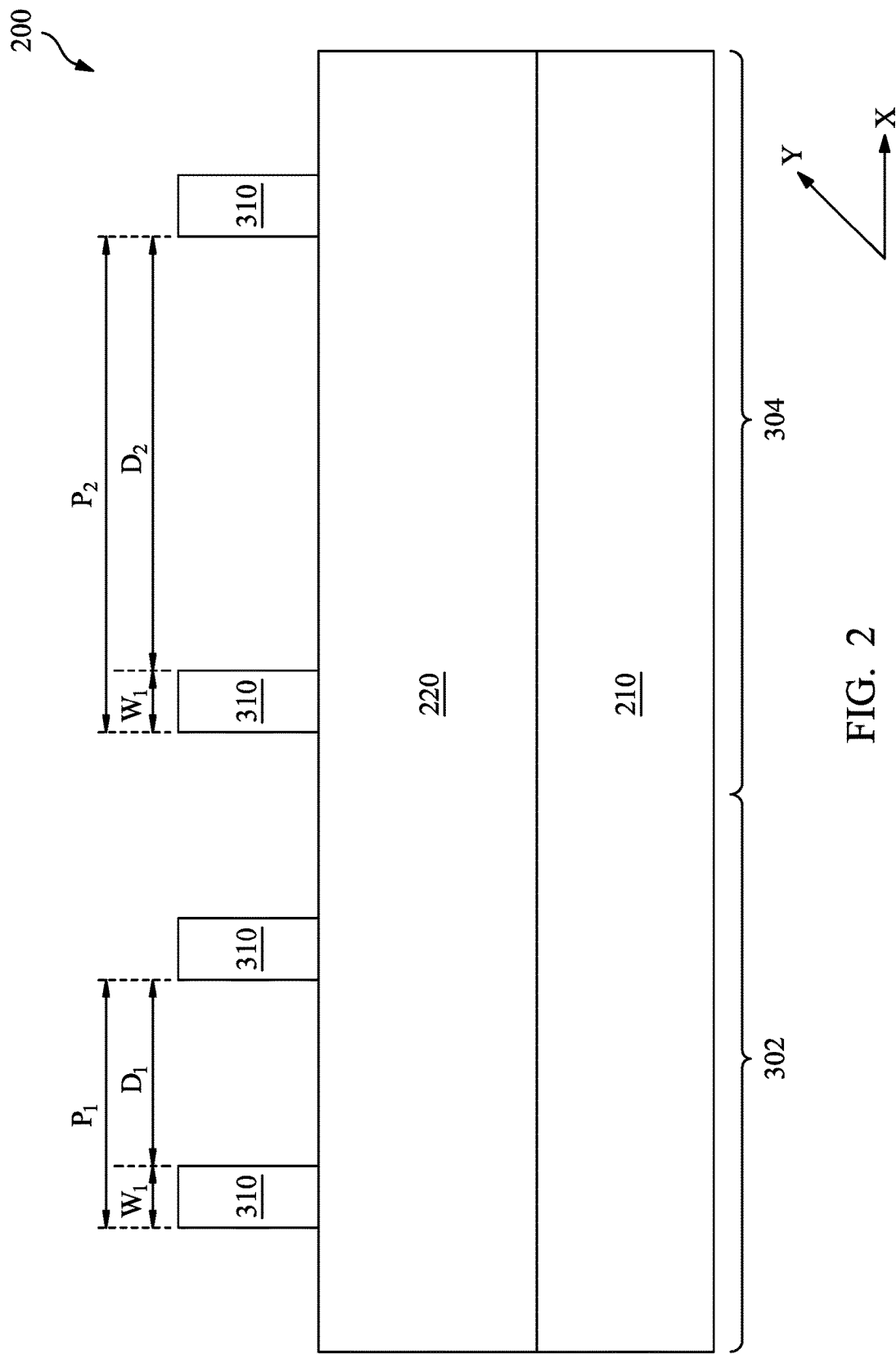
FIGS. 2, 3, 4, 5, 6A, 6B, 7, 8, 9 and 10 are cross-sectional views of an example semiconductor device in accordance with some embodiments.

Referring to FIGS. 1 and 2, the method 100 begins at step 102 by forming a material layer 220 over a substrate 210. The substrate 210 includes silicon. The material layer 220 may include a dielectric material such as silicon oxide, silicon nitride, silicon oxynitride, or a conductive material such as polysilicon, and/or other suitable materials. The material layer 220 may be deposited by thermal oxidation chemical vapor deposition (CVD), atomic layer deposition (ALD), physical vapor deposition (PVD), thermal oxidation, combinations thereof, or other suitable techniques.

Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials or a combination thereof.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Referring again to FIGS. 1 and 2, the method 100 proceeds to step 104 by forming a plurality of hard mask features 310 over the material layer 220. In some embodiments, the hard mask features 310 are dummy features and will be removed at a later fabrication stage. The hard mask features 310 are also referred to as mandrels 310. A layout of the mandrels 310 may have various configurations. For example, the layout of the mandrels 310 has a non-periodic structure, in which mandrel 310 has various width from one mandrel 310 to another mandrel 310 and various space between two adjacent mandrels 310.

In the present embodiment, the substrate 210 includes a first region 302 and a second region 304. Features formed in the first region 302 have different dimensions than those features formed in the second region 304. For example, features having a smaller pitch (e.g. for a high performance logic transistor) will be formed in the first region 302 while features having a larger pitch (e.g. for an I/O transistor) will be formed in the second region 304. The mandrels 310 are oriented in the Y direction and are spaced apart from one another along the X direction which is perpendicular to the Y direction. In the present embodiment, mandrels 310 define various openings such that the material layer 220 is exposed within the openings.

The mandrel 310 has a first width $W_1$, which may be a constant or alternatively be a variable that changes from one mandrel 310 to another mandrel 310. In the first region 302, two adjacent mandrels 310 are spaced from each other by a first distance $D_1$. While in the second region 304, two adjacent mandrels 310 are spaced away from each other by a second distance $D_2$, which is different than the first distance $D_1$. In an embodiment, the second distance $D_2$ is greater than the first distance $D_1$. Thus, a first pitch $P_1$ in the first region 302 is collectively determined by a sum of the first width $W_1$ and the first distance $D_1$. Likewise, a second pitch $P_2$ in the second region 302 is collectively determined by a sum of the first width $W_1$ and the second distance $D_2$. Accordingly, second pitch $P_2$ is greater than first pitch $P_1$.

The mandrels 310 may be formed by a procedure including deposition, patterning, etching, and/or a combination thereof. In some embodiments, the formation of the mandrels 310 may include depositing a mandrel material layer; forming a resist pattern; and etching the mandrel material layer using the resist layer as an etch mask, thereby forming the mandrel 310. The mandrel material layer may include silicon oxide, silicon nitride, oxynitride, silicon carbide, titanium oxide, titanium nitride, tantalum oxide, tantalum nitride, and/or any suitable materials. In the present embodiment, the mandrel material layer includes a material which is different from the material layer 220 to achieve etching selectivity in subsequent etches. The mandrel material layer may include multiple layers. The mandrel material layer may be deposited by a suitable technique, such as CVD, PVD, ALD, spin-on coating, and/or other suitable technique. The resist pattern includes a resist material sensitive to a radiation beam and is formed by a lithography process. In one example, the lithography process includes coating a resist layer on the mandrel material layer, performing a lithography exposure process to the resist layer according to the IC layout and developing the exposed resist layer to form the resist pattern. The etching process includes a wet etch, a dry etch, and/or a combination there.

Figure 3:
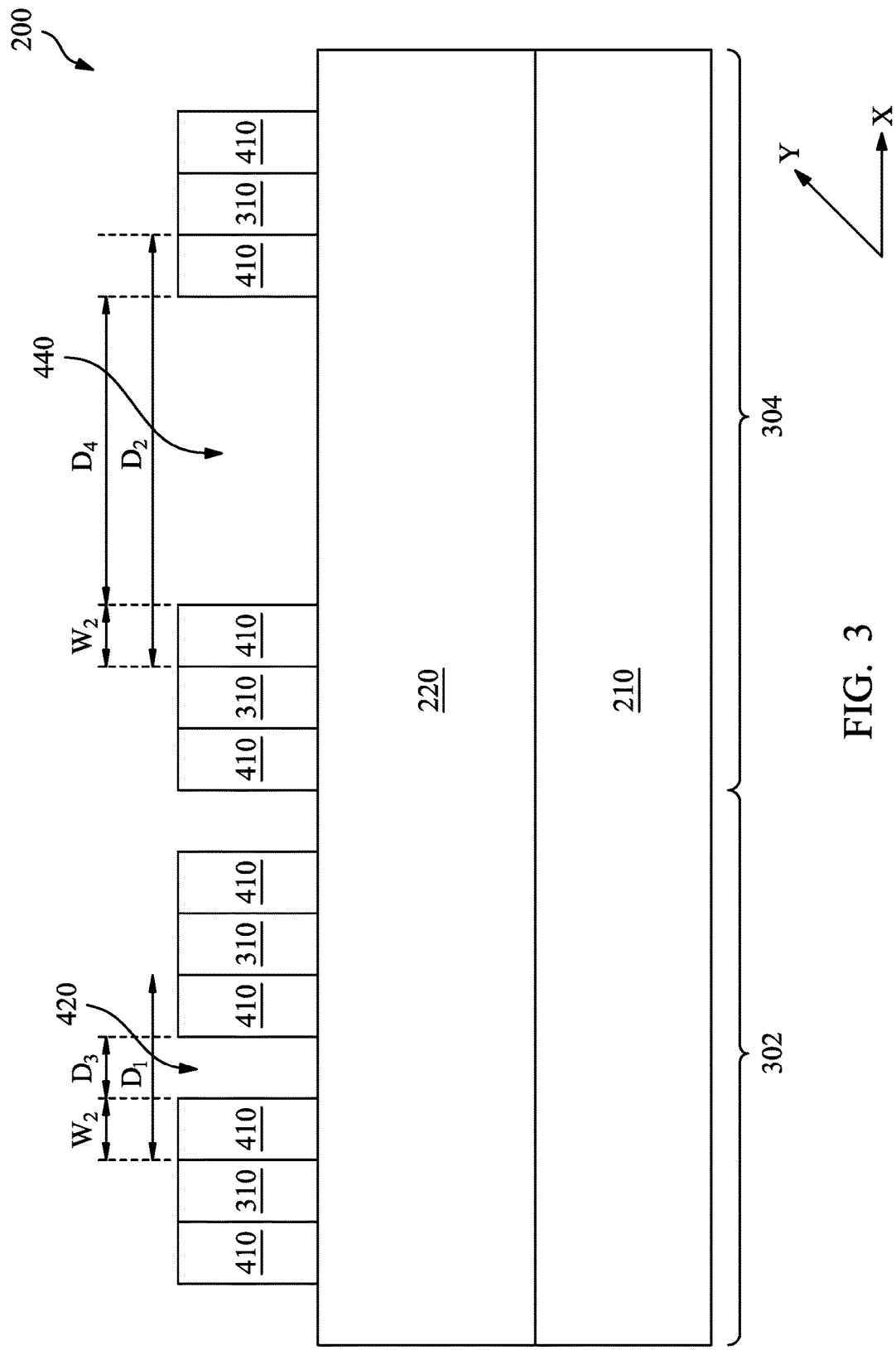

Referring to FIGS. 1 and 3, the method 100 proceeds to step 106 by forming spacers 410 along sidewalls of the mandrels 310 in both the first region 302 and the second region 304. The spacers 410 may be formed by depositing a spacer material layer over the mandrels 310, and followed by a spacer etch to etch the spacer material layer anisotropically. The spacer material layer may include silicon oxide, silicon nitride, oxynitride, silicon carbide, titanium oxide, titanium nitride, tantalum oxide, tantalum nitride, and/or any suitable materials. In the present embodiment, the spacer material layer includes a material which is different from the mandrels 310 and the material layer 220 to achieve etch selectivity in a subsequent etch. The spacer layer may be deposited by CVD, ALD, PVD, or other suitable techniques. In one embodiment, the spacer material layer is deposited by ALD to achieve conformable film coverage along the sidewalls of the mandrels 310. The thickness of the spacer material layer is referred to as a second width $W_2$. In some embodiments, the spacer material layer is etched by an anisotropic etch to form a vertical profile. The anisotropic etch may include a plasma etch in one example The spacers 410 are oriented in the Y direction and spaced from each other in the X direction. In the present embodiment, a first space (or opening) 420 is formed between two adjacent spacers 410 in the first region 302 and has a third distance D3, which is equal to $(D_1-2\ W_2)$. While a second space (or opening) 440 is formed between two adjacent spacers 410 in the second region 304 and has a fourth distance $D_4$, which is equal to $(D_2-2\ W_2)$. In an embodiment, by choosing the first distance $D_1$ and the second width $W_2$, the third distance $D_3$ is designed to be equal to the first width $W_1$.

Figure 4:
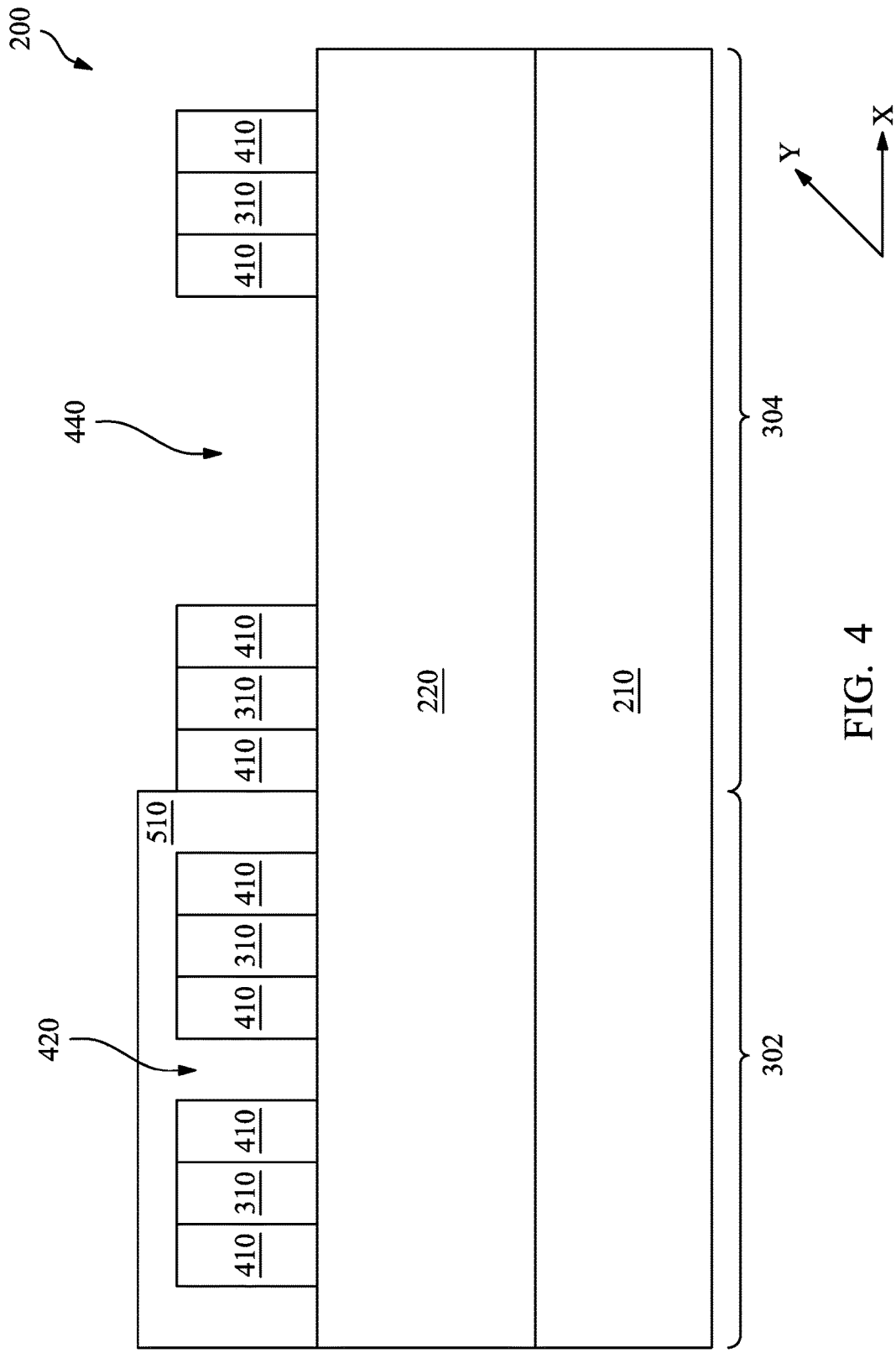

Referring to FIGS. 1 and 4, the method 100 proceeds to step 108 by forming a patterned hard mask (HM) 510 to cover the first region 302 while leaving the second region 304 uncovered (or exposed). In some embodiments, the patterned HM 510 may include a patterned photoresist layer formed by a lithography process. An exemplary lithography process may include forming a photoresist layer, exposing the photoresist layer by a lithography exposure process, performing a post-exposure bake process, and developing the photoresist layer to form the patterned resist layer.

Alternatively, the patterned HM 510 may be formed by depositing a HM layer, forming a patterned photoresist layer over the HM layer by a lithography process and etching the HM layer through the patterned photoresist layer to form the patterned HM 510. The patterned HM 510 layer may include silicon oxide, silicon nitride, silicon oxynitride, a low-k dielectric, silicon carbide, titanium oxide, titanium nitride, tantalum oxide, tantalum nitride, combinations thereof, and/or other suitable materials. In the present embodiment, the patterned HM 510 includes a material which is different from the material layer 220, the mandrels 310 and the spacers 410 to achieve etching selectivity in subsequent etches. The HM layer may be deposited by CVD, ALD, PVD, thermal oxidation, spin-on coating, combinations thereof, and/or other suitable techniques.

Figure 5:
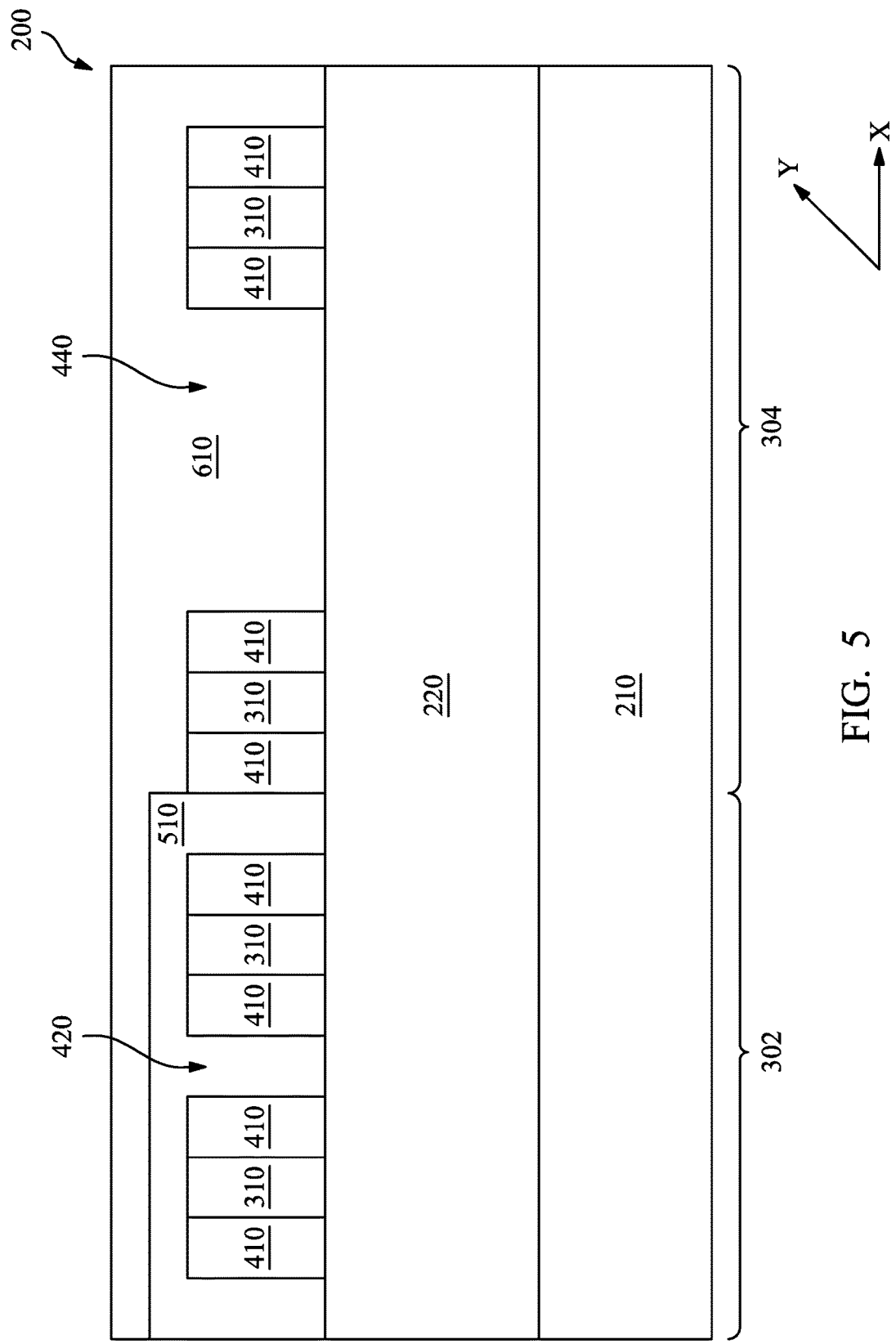

Referring to FIGS. 1 and 5, the method 100 proceeds to step 110 by depositing a filling layer 610 in the second region 304 such that the second space 440 is filled in by the filling layer 610. Also, as shown, filling layer 610 is deposited over patterned HM 510 is the first region 302. The filling layer 610 may include silicon oxide, silicon nitride, silicon oxynitride, a low-k dielectric, silicon carbide, and/or other suitable materials. The filling layer 610 may be deposited by CVD, ALD, PVD, thermal oxidation, spin-on coating, combinations thereof, and/or other suitable techniques. In the present embodiment, the filling layer 610 includes a material which is different from the material layer 220 and the patterned HM 510 to achieve etching selectivity in subsequent etches.

Figure 6A:
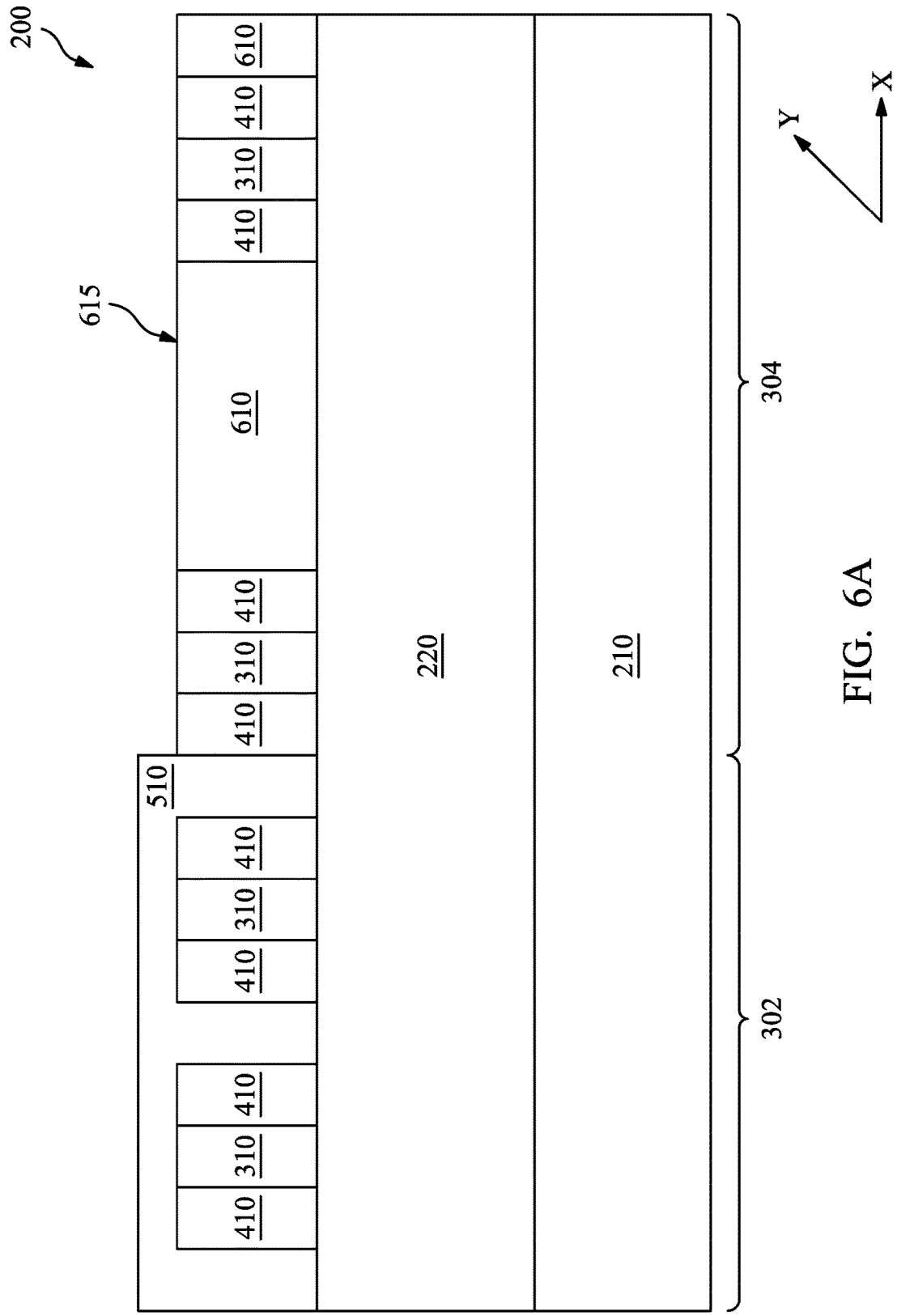
Figure 6B:
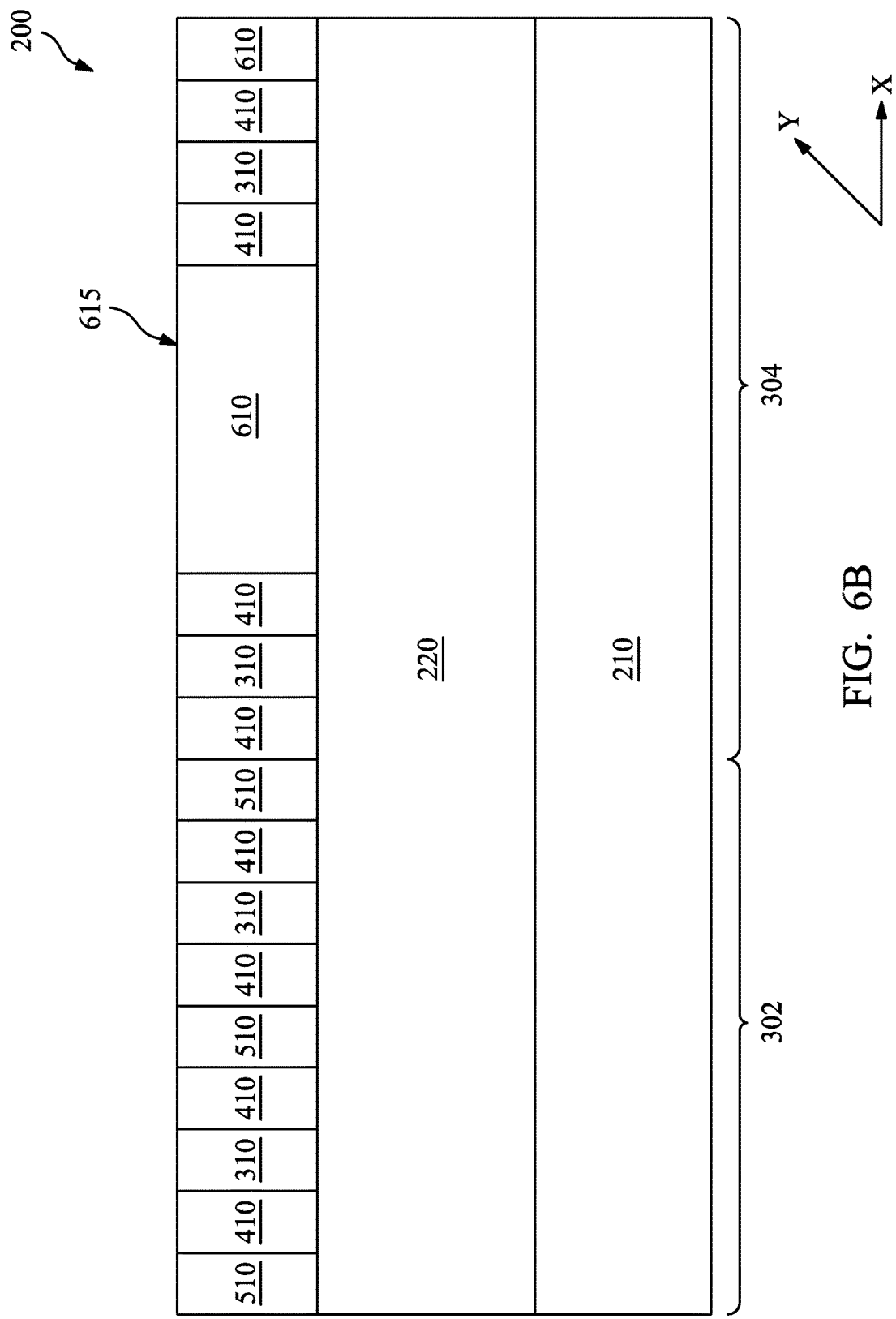

Referring to FIGS. 1, 6A and 6B, the method 100 proceeds to step 112 by recessing the filling layer 610 to expose top surfaces of the mandrels 310 in the second region 304 and the patterned HM 510 in the first region 302. In the present embodiment, the remaining filling layer 610 within the second space 440 forms a filling block 615. The etch process may include a wet etch, a dry etch, and/or a combination thereof. As an example, a wet etching solution may include $HNO_3$, $NH_4OH$, KOH, HF, HCl, NaOH, $H_3PO_4$, TMAH, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. In some embodiments, as has been mentioned previously, the etch process is chosen to selectively etch the filling layer 610 without substantially etching the patterned HM 510. The filling layer 610 is etched back in the second region 304 while the filling layer 610 overlying the patterned hard mask 510 is selectively removed, as shown in FIG. 6A.

Alternatively, in some embodiments, a non-selective etching back is performed such as using a chemical mechanical polishing (CMP) to removing excessive the filling layer 610 and the excessive patterned HM 510, as shown in FIG. 6B. A depth of etching back is controlled such that top surfaces of the mandrels 310 are exposed in both the first and second regions, 302 and 304, and the second space 440 remains filled by the filling layer 610 to form the filling block 615.

Figure 7:
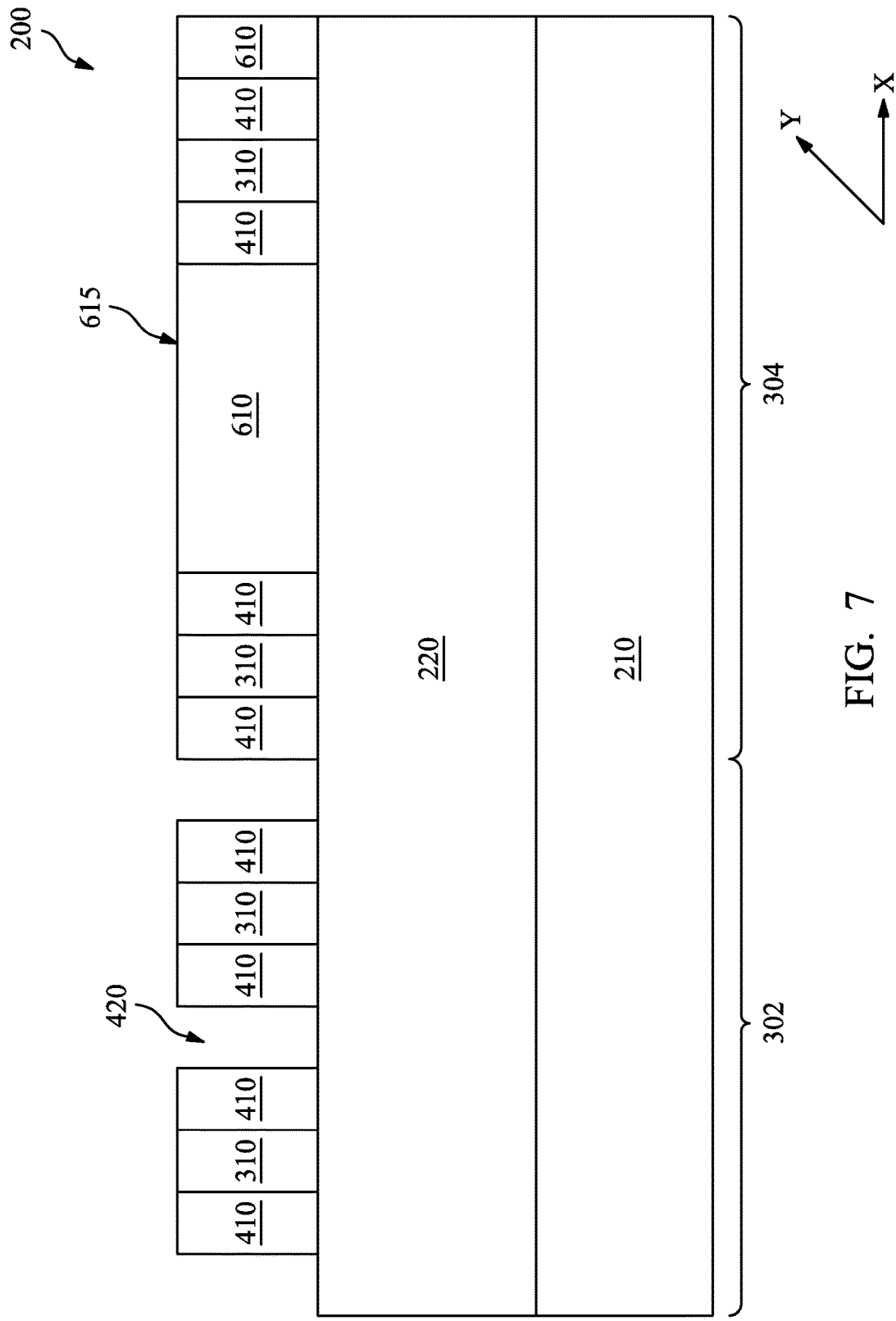

Referring to FIGS. 1 and 7, the method 100 proceeds to step 114 by removing the patterned HM 510 from the first region 302. The etch process may include a wet etch, a dry etch, and/or a combination thereof. As an example, a wet etching solution may include $HNO_3$, $NH_4OH$, KOH, HF, HCl, NaOH, $H_3PO_4$, TMAH, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. As has been mentioned previously, the etch process is chosen to selectively etch the patterned HM 510 without substantially etching the substrate 210, the mandrels 310, the spacers 410 and the filling block 615. The selective etch may include a selective wet etch, a selective dry etch, and/or a combination thereof. As a result, the first space 420 is revealed in the first region 302 while the second space 440 remains filled by the filling block 615.

Figure 8:
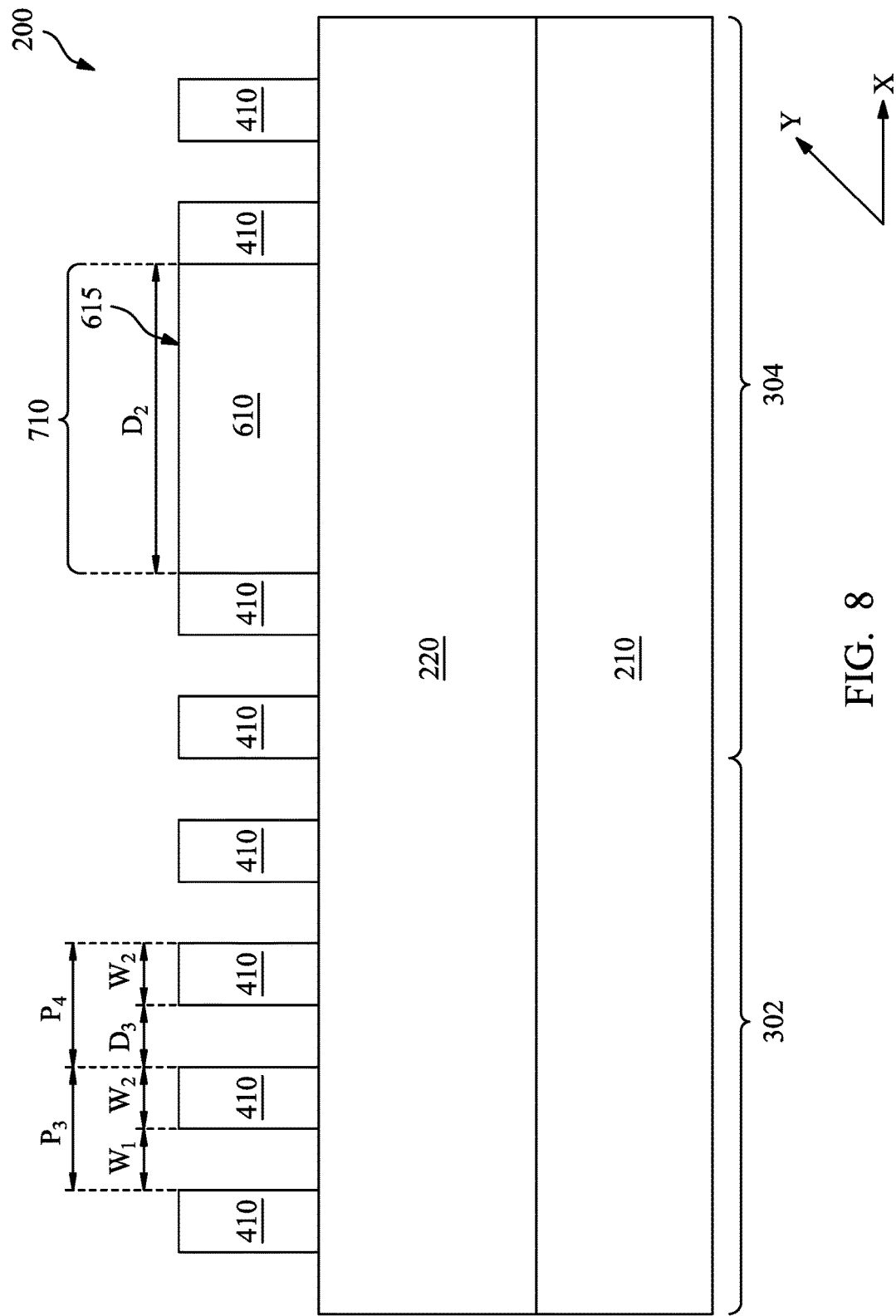

Referring to FIGS. 1 and 8, the method 100 proceeds to step 116 by removing exposed mandrels 310 in both of the first and second regions, 302 and 304. The etch process may include a wet etch, a dry etch, and/or a combination thereof. As an example, a wet etching solution may include $HNO_3$, $NH_4OH$, KOH, HF, HCl, NaOH, $H_3PO_4$, TMAH, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. In some embodiments, the mandrels 310 are removed by a selective etch without substantially etching the material layer 220, the spacers 410 and the filling block 615. The selective etch may include a selective wet etch, a selective dry etch, and/or a combination thereof.

As a result, adjacent spacers 410 in the first region 302 are spaced apart from each other by either the first width $W_1$ or by the third distance $D_3$ (as discussed above with respect to FIGS. 2 and 3). A third pitch $P_3$ is therefore collectively determined by a sum of the first width $W_1$ and the second width $W_2$. Likewise, a fourth pitch $P_4$ is therefore collectively determined by a sum of the second width $W_2$ and the third distance $D_3$. In an embodiment, the third distance $D_3$ is chosen to be same as the second width $W_2$, thus the third pitch $P_3$ is the same as the fourth pitch $P_4$ to form a periodic (regular) pattern with a pitch being equal to $(W_1+W_2)$.

As can been seen, the disclosed process reduces the pitch size in the first region 302. That is, the mandrel features originally formed in the first region 310 had a first pitch $P_1$ ($W_1+D_1$ as shown in FIG. 2) and now the later formed spacers 410 have either the third pitch $P_3$ ($W_1+W_2$), or the fourth pitch $P_4$ ($W_2+D_3$) both of which are smaller than the first pitch $P_1$. It is noted that the second width $W_2$ is the width of the spacer 410 and is defined by spacer deposition thickness, which can be controlled precisely by deposition process condition, such as deposition time. Thus, the first pitch $P_1$ is not only reduced to the third pitch $P_3$ (or the fourth pitch $P_4$) but also the third pitch $P_3$ (or the fourth pitch $P_4$) inherits good width control. In other words, a smaller pitch (the third pitch $P_3$ or the fourth pitch $P_4$) is achieved by a procedure that has more relaxed constraints as compared to a traditional lithography process to form smaller pitches.

As discussed above, step 116 of method 100 also includes removing the exposed mandrels 310 in the second region 304. This removal of mandrel features from the second region 304 can occur during the same process used to remove the exposed mandrel features in the first region 302. In alternative embodiments, the removal of the exposed mandrel features in the second region 304 occurs before or after the removal of the exposed mandrel features in the first region 302. The removal of the mandrel features in the second regions results in the formation of a block feature 710 being formed. Block feature 710 includes the filling block 615 and the spacers 410 along its sidewalls. The block feature 710 carries the second distance $D_2$ (as discussed above with respect to FIGS. 2 and 3).

Figure 9:
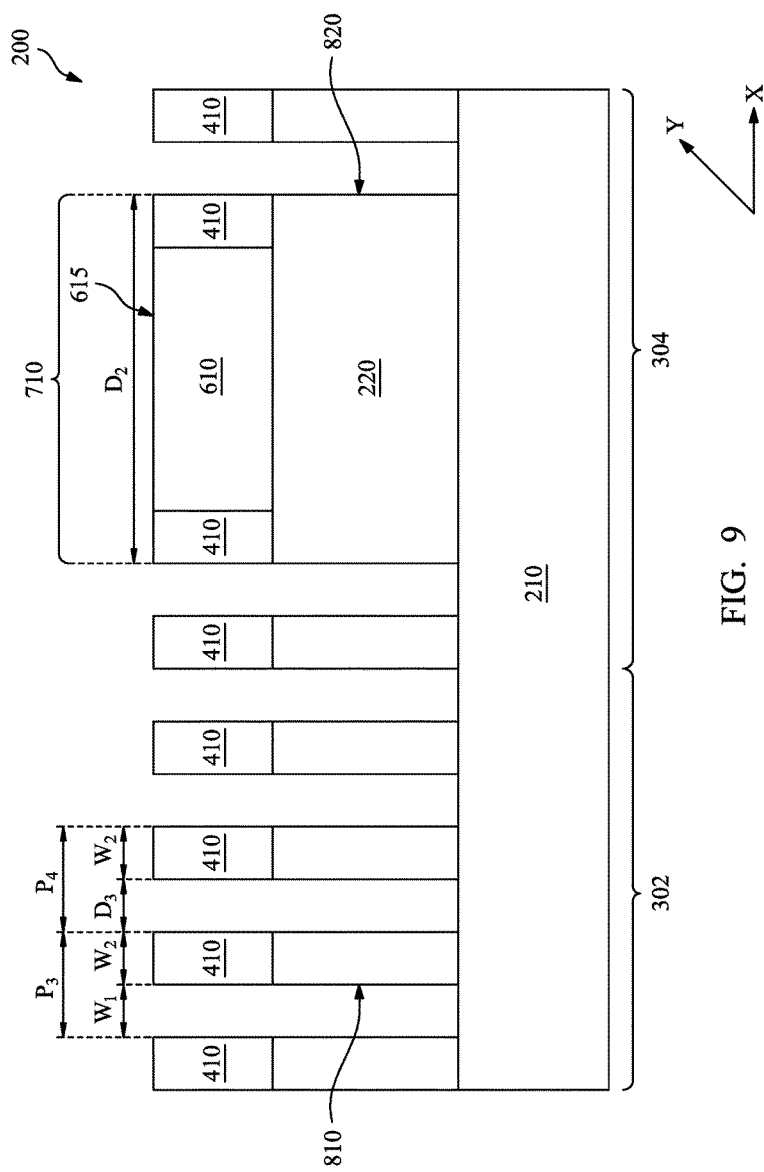
Figure 10:
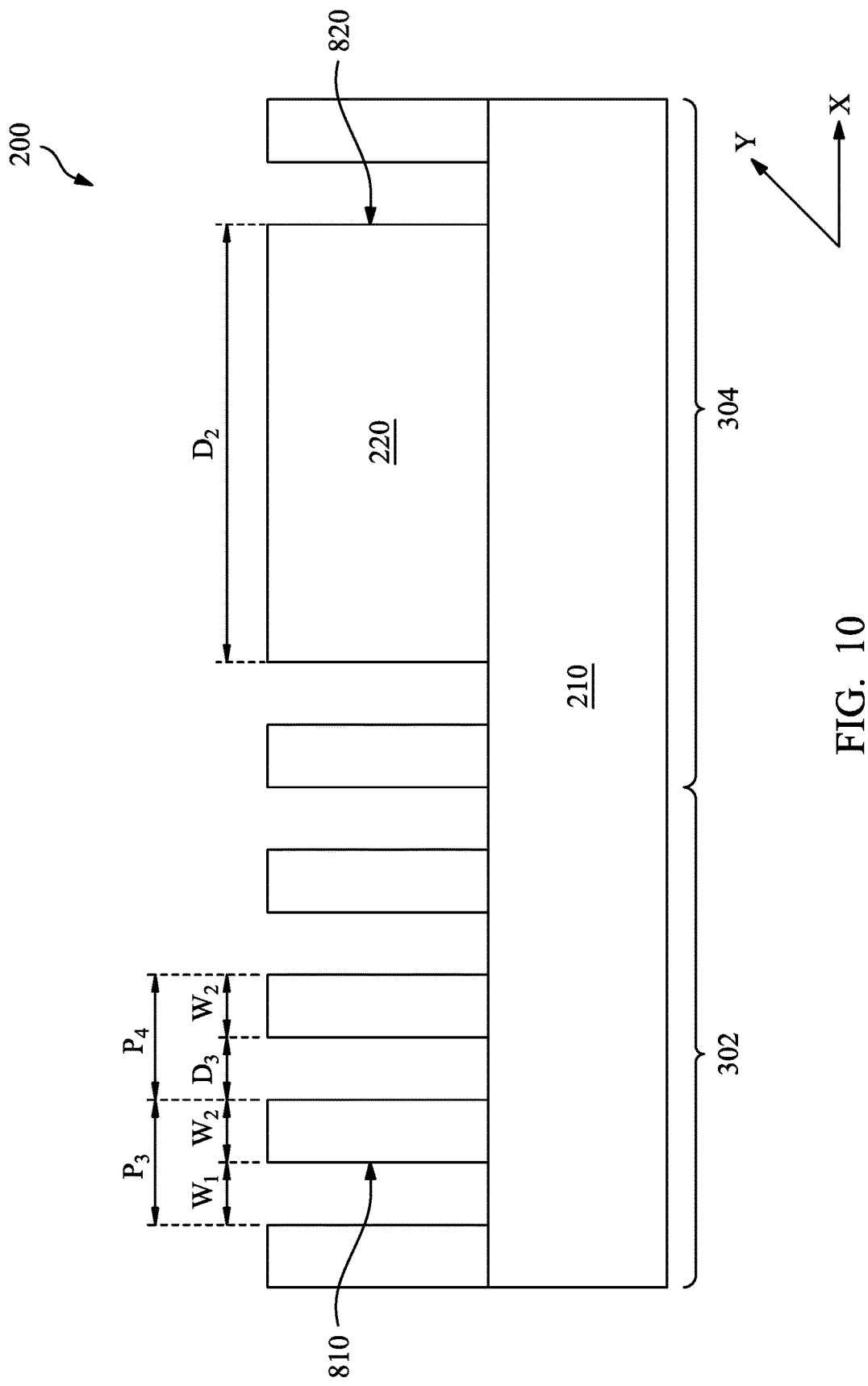

Referring to FIGS. 1 and 9, the method 100 proceeds to step 118 by etching the material layer 220 by using the spacers 410 and the block feature 710 as an etch mask. As a result, in the first region 302, the spacers 410 are transferred to first material features 810 in the material layer 220 while in meantime, in the second region 304, the block feature 710 is transferred to a second material feature 820 in the material layer 220. In some embodiments, the etch process may include an anisotropic etch, such as a plasma anisotropic etch. Accordingly, the first and second material features, 810 and 820, are formed with vertical profiles. Thus, in the first region 302, the first material feature 810 carries the second width $W_2$ and the third pitch $P_3$, or the fourth pitch $P_4$. While in the second region, the second material feature 820 carries the second distance $D_2$. After forming the first and second material features, 810 and 820, the spacers 410 and the filling block 710 are removed by a proper etch process, as shown in FIG. 10.

It is noted that, in the first region 302, the width of the first material feature 810 and the pitch of the first material feature 810 are defined by the first width $W_1$ (of the mandrel 310 in FIG. 2), the first distance $D_1$ (as shown in FIG. 2) and the second width $W_2$ (of the spacer 410 in FIG. 3). In the second region 304, the width of the second material feature 820 is defined by the second distance $D_2$. Therefore, by choosing various combinations of these parameters (e.g. $W_1$, $D_1$, $W_2$ and $D_2$), various widths of material features in various regions of the device 200 are achieved with a great degree of flexibility in comparison to traditional methodologies.

Additional steps can be provided before, during, and after the method 100 or 1000, and some of the steps described can be replaced or eliminated for other embodiments of the method.

Based on the above, the present disclosure offers methods for forming various feature size in a device. The method employs forming a patterned hard mask to define regions in the device and then depositing a filling layer to fill in a space or spaces in designated region/regions. The method also employs using the filling layer in the space or spaces as an additional etch mask to form a feature in the designated region, which has a different size comparing a feature formed without the filling layer as an additional etch mask. The method provides flexibility and feasibility in forming features with various sizes in the device.

The present disclosure provides many different embodiments of fabricating a semiconductor device that provide one or more improvements over existing approaches. In one embodiment, a method for fabricating a semiconductor device includes forming a first, a second, a third and a fourth mandrel over a material layer. The first and the second mandrels are formed over a first region of the material layer and space away by a first distance $D_1$ and the third and the fourth mandrels are formed over a second region of the material layer and space away by a second distance $D_2$. The method also includes forming spacers along sidewalls of the first, second, third and fourth mandrels, forming a patterned hard mask to cover the first region, depositing a filling layer in the second region while the patterned hard mask covers the first region. A space between two adjacent spacers in the second region is filled in by the filling layer. The method also includes recessing the filling layer to form a filling block in the space between two adjacent spacers in the second region, removing the patterned hard mask, removing the first, second, third and fourth mandrels and etching the material layer by using spacers and the filling block as an etch mask to form material features in the first region and the second region, respectively.

In another embodiment, a method includes forming a material layer over a substrate, the substrate having a first region and a second region, forming a first pair of mandrels over the material layer in the first region and a second pair of mandrel over the material in the second region and forming spacers along sidewalls of the first and second pairs of mandrels. After forming the spacers along the sidewall of the first and second pairs of mandrels, the first pair of mandrels is separated away from each other by a first space and the second pair of mandrel is separated away from each other by a second space. The method also includes filling in the second space in the second region with a filling layer while the first space in the first region is un-filled, removing the first pair of mandrels in the first region and the second pair of mandrels in the second region and etching the material layer by using spacers and the filling layer as an etch mask to form a first material feature in the first region and a second material feature in the second region.

In yet another embodiment, a method includes forming a first mandrel and a second mandrel over a material layer. The first mandrel has a first sidewall facing a second sidewall of the second mandrel. The method also includes forming a first spacer along the first sidewall and a second spacer along the second sidewall such that a space exists between the first and second spacer, filling in the space with a filling layer, recessing the filling layer to expose top surfaces of the first and second mandrels, removing the first and second mandrels while the space is filled by the filling layer and etching the material layer by using spacers and the filling layer within the space as an etch mask to form a material feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first, a second, a third and a fourth mandrel over a material layer, wherein the first and the second mandrels are formed over a first region of the material layer and spaced away by a first distance $D_1$, wherein the third and the fourth mandrels are formed over a second region of the material layer and spaced away by a second distance $D_2$;
   forming spacers along sidewalls of the first, second, third and fourth mandrels without covering top surfaces of the first, second, third, and fourth mandrels;
   forming a patterned hard mask to cover the first region;
   depositing a filling layer in the second region while the patterned hard mask covers the first region, wherein a space between two adjacent spacers in the second region is filled in by the filling layer;
recessing the filling layer to form a filling block in the space between two adjacent spacers in the second region;
removing the patterned hard mask;
removing the first, second, third and fourth mandrels; and
etching the material layer by using spacers and the filling block as an etch mask to form material features in the first region and the second region, respectively.

2. The method of claim 1, wherein the second distance $D_2$ is greater than the first distance $D_1$.

3. The method of claim 1, wherein recessing the filling layer to form the filling block in the space between the two adjacent spacers in the second region includes recessing the filling layer to expose top surfaces of the third and fourth mandrels in the second region and expose the patterned hard mask in the first region.

4. The method of claim 3, wherein the removing the patterned hard mask includes performing a selective etch using a first etchant to selectively remove the pattern hard mask without substantially etching the first, second, third and fourth mandrels, the spacers and the filling block and the removing of the first, second, third and fourth mandrels includes performing a selective etch using a second etchant to selectively remove the first, second, third and fourth mandrels.

5. The method of claim 4, wherein the first etchant comprises $HNO_3$, $NH_4OH$, $KOH$, $HF$, $HCl$, $NaOH$, $H_3PO_4$, TMAH, or mixtures thereof and the second etchant comprises $HBr$, $CHBr_3$, $Cl_2$, $CHCl_3$, $CCl_4$, $BCl_3$, $CF_4$, $SF_6$, $CH_2F_4$, $CHF_3$, $C_2F_6$, or mixtures thereof.

6. The method of claim 1, wherein recessing the filling layer to form the filling block in the space between two adjacent spacers in the second region includes recessing the filling layer and the patterned hard mask such that top surfaces of the first, the second, the third and the fourth mandrels are exposed.

7. The method of claim 1, wherein the first, second, third and fourth mandrels are removed by a selective etch without substantially etching the spacers and the filling block.

8. The method of claim 1, wherein the patterned hard mask comprises titanium oxide, titanium nitride, tantalum oxide, tantalum nitride or combinations thereof.

9. A method comprising:
forming a material layer over a substrate, the substrate having a first region and a second region;
forming a first pair of mandrels over the material layer in the first region and a second pair of mandrel over the material in the second region;
forming spacers along sidewalls of the first and second pairs of mandrels without covering top surfaces of the first and second pairs of mandrels, wherein after forming the spacers along the sidewall of the first and second pairs of mandrels, the first pair of mandrels is separated away from each other by a first space and the second pair of mandrel is separated away from each other by a second space;
filling in the second space in the second region with a filling layer while the first space in the first region is un-filled;
removing the first pair of mandrels in the first region and the second pair of mandrels in the second region; and
etching the material layer by using spacers and the filling layer as an etch mask to form a first material feature in the first region and a second material feature in the second region.

10. The method of claim 9, wherein filling in the second space in the second region with the filling layer while the first space in the first region is un-filled includes:
forming a patterned hard mask to cover the first region;
depositing the filling layer over the first region and the second region;
recessing the filling layer; and
removing the patterned hard mask.

11. The method of claim 10, wherein recessing the filling layer includes:
recessing the filling layer and the patterned hard mask such that first pair of mandrels and second pair of mandrels are exposed; and
removing remaining patterned hard mask.

12. The method of claim 10, wherein recessing the filling layer includes recessing the filling layer to expose the second pair of mandrels in the second region and expose the patterned hard mask in the first region.

13. The method of claim 9, wherein removing the first pair of mandrels in the first region and the second pair of mandrels in the second region includes removing the first and second pair of mandrels by a selective etch without substantially etching the spacers and the filling block.

14. The method of claim 9, wherein the first pair of mandrels are spaced apart from each other by a first distance $D_1$, and
wherein the second pair of mandrels are spaced apart from each other by a second distance $D_2$ which is greater than the first distance $D_1$.

15. The method of claim 14, wherein the second material feature has a width that is same as the second distance $D_2$.

16. The method of claim 9, wherein a distance between two adjacent the first material features is smaller than the first distance $D_1$.

17. A method comprising:
forming a first mandrel, a second mandrel, and a third mandrel over a material layer, wherein the first mandrel has a first sidewall facing a second sidewall of the second mandrel and the second mandrel has a third sidewall facing a fourth sidewall of the third mandrel;
forming a first spacer along the first sidewall, a second spacer along the second sidewall, a third spacer along the third sidewall, and a fourth spacer along the fourth sidewall such that a first space exists between the first and second spacers, a second space exists between the third and the fourth spacers, and top surfaces of the first, second, and third mandrel are exposed;
forming a hard mask to cover the first mandrel, the second mandrel and the first space without covering the third mandrel and the second space;
filling in the second space with a filling layer;
recessing the filling layer and the hard mask to expose top surfaces of the first and second mandrels;
removing the hard mask by selectively etching the hard mask;
removing the first, second, and third mandrels while the second space is filled by the filling layer; and
etching the material layer by using spacers and the filling layer within the space as an etch mask to form a material feature.

18. The method of claim 17, further comprising removing the first and second spacers and the filling layer after forming the material feature.

19. The method of claim 17, wherein the forming the hard mask includes:

depositing a hard mask material layer over the first mandrel, the second mandrel, the third mandrel, the first space and the second space; and removing the hard mask material layer over the third mandrel and the second space by selectively etching the hard mask material.

20. The method of claim 17, wherein the first mandrel is in is a logic transistor region and the third mandrel is in an input/output transistor region.

\* \* \* \* \*